(12) United States Patent
Tang

(10) Patent No.: US 8,987,609 B2
(45) Date of Patent: Mar. 24, 2015

(54) PRINTED CIRCUIT BOARD STRUCTURE

(71) Applicants: Hong Fu Jin Precision Industry (ShenZhen) Co., Ltd., Shenzhen (CN); Hon Hai Precision Industry Co., Ltd., New Taipei (TW)

(72) Inventor: Hai-Dong Tang, Shenzhen (CN)

(73) Assignee: Zhongshan Innocloud Intellectual Property Services Co., Ltd., Zhongshan (CN)

(*) Notice: Subject to any disclaimer, the term of this patent is extended or adjusted under 35 U.S.C. 154(b) by 0 days.

(21) Appl. No.: 14/066,660

(22) Filed: Oct. 29, 2013

(65) Prior Publication Data

US 2014/0345909 A1    Nov. 27, 2014

(30) Foreign Application Priority Data

May 23, 2013    (CN) .................... 2013 2 0285576 U

(51) Int. Cl.
*H05K 1/00*    (2006.01)
*H05K 1/03*    (2006.01)
*H05K 1/02*    (2006.01)

(52) U.S. Cl.
CPC .................................. *H05K 1/0271* (2013.01)
USPC ........................... 174/268; 174/255; 174/257

(58) Field of Classification Search
USPC .......................................... 174/255–257, 268
See application file for complete search history.

(56) References Cited

U.S. PATENT DOCUMENTS

| 5,479,138 | A | * | 12/1995 | Kuroda et al. | ..................... 333/1 |
| 5,675,299 | A | * | 10/1997 | Suski | ................. 333/1 |
| 6,278,345 | B1 | * | 8/2001 | Dai | ............................ 333/238 |
| 2001/0000702 | A1 | * | 5/2001 | Mensinger | ..................... 373/10 |
| 2001/0010271 | A1 | * | 8/2001 | Lin et al. | ........................ 174/255 |
| 2006/0272851 | A1 | * | 12/2006 | Haridass et al. | ............. 174/255 |
| 2008/0142257 | A1 | * | 6/2008 | Becker et al. | ................. 174/264 |
| 2008/0151521 | A1 | * | 6/2008 | Lin et al. | ........................ 361/777 |
| 2009/0294152 | A1 | * | 12/2009 | Lin | ................................ 174/250 |

* cited by examiner

*Primary Examiner* — Hoa C Nguyen
(74) *Attorney, Agent, or Firm* — Novak Druce Connolly Bove + Quigg LLP

(57) ABSTRACT

A printed circuit board structure comprises a base layer, an insulation layer, and a signal layer sandwiched between the base layer and the insulation layer. The insulation layer includes a plurality of conductive regions. The conductive regions are used for providing a current reflowing path. Each of the conductive regions comprises a plurality of empty regions which are spaced from each other. A space inside the empty region is substantially hollow, and spaces between adjacent empty region are filled with cooper.

5 Claims, 2 Drawing Sheets

PRINTED CIRCUIT BOARD STRUCTURE

BACKGROUND

1. Technical Field

The present disclosure relates to a printed circuit board structure.

2. Description of Related Art

Most Printed circuit boards (PCBs) include a base layer, an insulation layer, and a signal layer sandwiched between the base layer and the insulation layer. The signal layer includes a plurality of traces and conductive regions. Conductive regions having a large area are filled with copper. During a solder pasting process, a reflow oven is used for stably soldering pads or elements on the PCB. However, rates of thermal expansion of the copper layer and the insulation layer are different from each other, which may result in the PCB warping during the solder pasting process.

Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout two views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at "least one."

Figure 1:
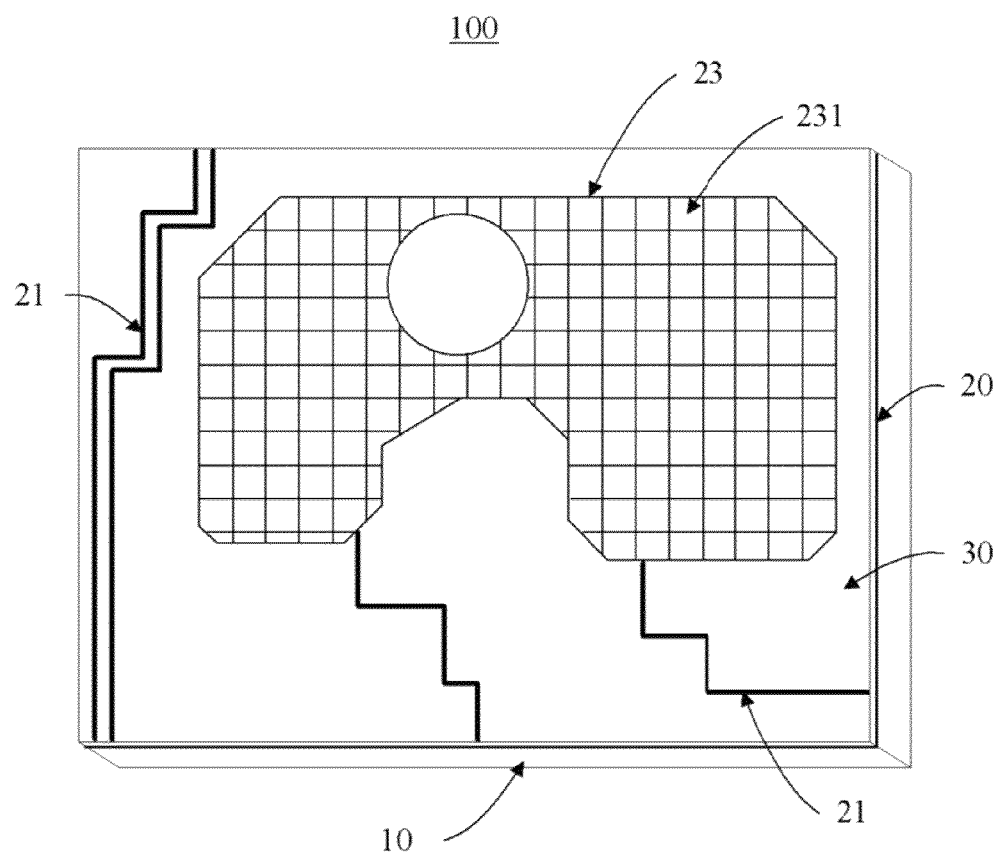
FIG. 1 is a schematic diagram of a printed circuit board in accordance with one embodiment.
Figure 2:
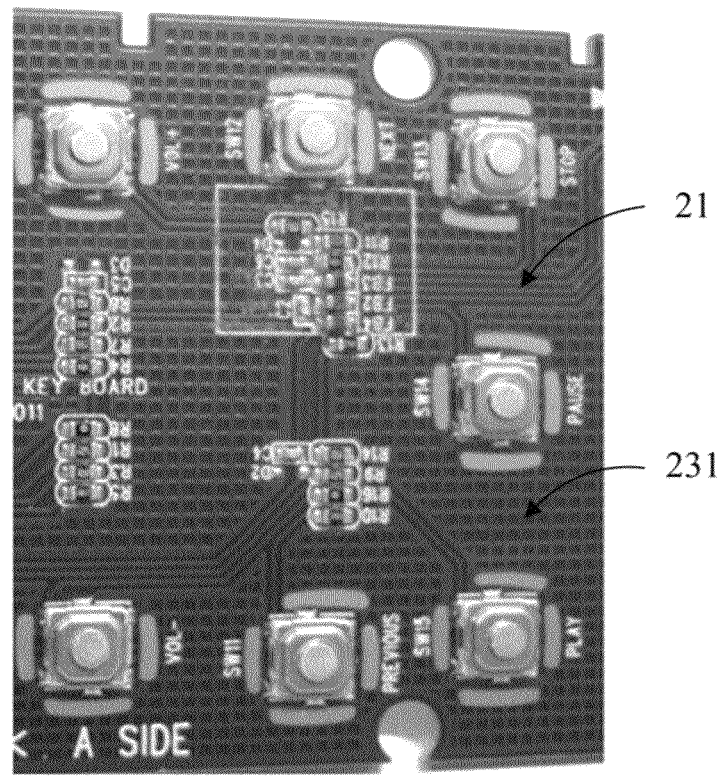
FIG. 2 is a schematic view of the electronic device of FIG. 1 in accordance with one embodiment.

FIGS. 1 and 2 show a printed circuit board (PCB) structure 100, according to one embodiment of the present disclosure. The PCB structure 100 includes copper regions arranged in a grid pattern for preventing deformation of the PCB structure 100 at high temperatures. In the embodiment, the PCB structure 100 is a single-sided PCB.

The PCB structure 100 includes a base layer 10, a signal layer 20, and an insulation layer 30.

The base layer 10 is substantially rectangular.

The signal layer 20 is sandwiched between the base layer 10 and the insulation layer 30. The signal layer 20 includes a plurality of traces 21 and a plurality of conductive regions 23. The traces 21 are used for transmitting signals. The conductive regions 23 cooperatively form an electric current pathway. Each of the conductive regions 23 comprises a plurality of empty regions 231 spaced from each other. A shape of each of the empty regions 231 is a substantially square. A space inside the empty region 231 is substantially hollow, and spaces between adjacent empty region 231 are filled with copper. A size and shape of the empty region 231 can be adjusted for satisfying different requirements. In the embodiment, the shape of the empty region 231 is a square. In other embodiments, a shape of the empty regions 231 can be triangle, polygonal, or that of any parallelogram.

Because the conductive region 23 of the PCB structure 100 is arranged in a grid pattern, a size of the copper area of the conductive regions 23 is reduced for reducing the warping of the conductive regions 23 during a solder pasting process, and an efficiency of manufacturing the PCB structure 100 is improved.

It is to be understood, however, that even though information and advantages of the present embodiments have been set forth in the foregoing description, together with details of the structures and functions of the present embodiments, the disclosure is illustrative only; and changes may be made in detail, especially in the matters of shape, size, and arrangement of parts within the principles of the present embodiments to the full extent indicated by the broad general meaning of the terms in which the appended claims are expressed.

What is claimed is:

1. A printed circuit board (PCB) structure comprising:
a base layer;
an insulation layer; and
a signal layer sandwiched between the base layer and the insulation layer;
wherein the signal layer comprises a plurality of conductive regions; the conductive regions are used for providing a current reflowing path; each of the conductive regions comprises a plurality of empty regions spaced from each other; a space inside the empty region is substantially hollow, and spaces between adjacent empty region are filled with copper.

2. The PCB structure of claim 1, wherein the empty regions is arranged in a grid patterns.

3. The PCB structure of claim 1, wherein a shape of the empty regions is a substantially polygonal.

4. The PCB structure of claim 1, wherein a shape of the empty region is adjustable for satisfying different requirements.

5. The PCB structure of claim 1, wherein the size of the empty region is adjustable for satisfying different requirements.

* * * * *